(12) United States Patent
Dubs et al.

(10) Patent No.: US 7,335,521 B2
(45) Date of Patent: Feb. 26, 2008

(54) METHOD FOR THE PRODUCTION OF MULTILAYER DISCS

(75) Inventors: Martin Dubs, Maienfeld (CH); Wolfgang Nutt, Balzers (LI); Helfried Weinzerl, Seal Beach, CA (US); Thomas Eisenhammer, Azmoos (CH)

(73) Assignee: OC Oerlikon Balzers AG, Balzers (LI)

( * ) Notice: Subject to any disclaimer, the term of this patent is extended or adjusted under 35 U.S.C. 154(b) by 407 days.

(21) Appl. No.: 11/167,952

(22) Filed: Jun. 28, 2005

(65) Prior Publication Data
US 2006/0003476 A1 Jan. 5, 2006

Related U.S. Application Data

(60) Provisional application No. 60/585,153, filed on Jul. 2, 2004.

(51) Int. Cl.
H01L 21/00 (2006.01)
H01L 21/44 (2006.01)
(52) U.S. Cl. .......... 438/22; 257/E21.226; 257/E21.122
(58) Field of Classification Search ................ 438/22, 438/106, 455
See application file for complete search history.

(56) References Cited

U.S. PATENT DOCUMENTS 5,017,835 A 5/1991 Oechsner 6,117,284 A 9/2000 Mueller
6,682,637 B2 1/2004 Heinz
6,835,936 B2 * 12/2004 Okada et al. .......... 250/370.11
2002/0036056 A1 * 3/2002 Shida et al. ................. 156/245
2006/0179448 A1 * 8/2006 Smith et al. ................. 720/718

FOREIGN PATENT DOCUMENTS

WO WO 00/18531 6/2000
WO WO 2005/035237 A1 4/2005

* cited by examiner

Primary Examiner—Walter Lindsay, Jr.
Assistant Examiner—Thu-Huong Dinh
(74) Attorney, Agent, or Firm—Pearne & Gordon LLP

(57) ABSTRACT

A Method for manufacturing an optical disc substrate comprises a first substrate with at least one structured surface, on which an anti-adhesive layer, preferably carbon, is deposited and first layer on top of said anti-adhesive layer. On a second substrate with a structured surface also a layer is deposited. Both substrates are bonded together with the layers facing each other. The separation now easily can take place afterwards alongside the adhesive layer. This way the first layer from the first substrate is being transferred to the second substrate.

11 Claims, 3 Drawing Sheets

METHOD FOR THE PRODUCTION OF MULTILAYER DISCS

This invention relates to multilayer disks, in particular DVD14/DVD18-disks, Dual-Layer-DVD/Recordable disks and Dual-Layer-Blu-Ray Disk.

BACKGROUND OF THE INVENTION

DVD-9 are produced by molding two separate disk halves with pits containing the information and then coating these disks with a semi-transparent and a reflective coating and bonding the two disk halves together. If more layers for higher capacity are desired, additional layers have to be added.

RELATED ART

In a first process step the double layer is produced as usual in a DVD-9 manufacturing process, as shown in FIG. 2: This requires a dummy substrate 60 made of PMMA or a similar material with a surface 60a. A metal layer 62, usually a fully reflective one, deposited on surface 60a adheres very weakly to the surface 60a. A second substrate 64 is made e.g. from polycarbonate PC by injection moulding. On this substrate 64 a layer 66, e.g. a semi-reflective one is being coated on. In a bonding step both substrates 60 and 64 are being glued together with the coated sides facing each other by means of an adhesive 68. After this bonding step the dummy substrate 60 can be separated easily from the metal layer 62 so that the sequence of layer 62, adhesive 68, layer 66 remains attached to substrate 64. If two of such dual layer disk halves again are glued together in a further bonding step, this results in an optical disc, e.g. a DVD 18 with four information layers as shown in Prior Art FIG. 1, where the substrates 1, 9 each carry the aforementioned semi-reflective layers 2, 8 and fully reflective layers 3, 7. Finally the substrates are bonded with adhesive 5.

Of course the combination of a double layer half disk and a single layer half disk is possible also.

This production process is frequently used in the manufacturing of DVD-14 and DVD-18. In the following this production process is referred to as the "surface transfer process".

Such a process is described also in U.S. Pat. No. 6,117,284. This document also mentions the use of a release material to ease the separation of the dummy substrate 60 from the metal layer 62. The '284 patent suggests silicone as release material, which could be applied on the substrate before coating surface 60a of substrate 60. However, surface tension effects may lead an inhomogenous distribution of the release material and thus to degrade the accuracy of the substrate's surface structure.

Another production process for the production of DVD-14 and DVD-18 disks consists in coating two disk halves first with a semireflective coating each, then applying a thermoplastic layer of approximately 50 micrometer thickness, embossing the second information layer by e.g. hot pressing, finally coating this embossed information layer with a reflective layer and bonding the two disk halves with two information layers each. A variation of this technology is the so called 2P-process, which consists in the steps of depositing a semireflective layer on a first substrate, applying a photopolymer resin, embossing the second data surface with a stamper and hardening the photopolymer with UV light, finally remove the stamper and metallize the embossed surface as before. This 2P-process is commonly also used in the production of Dual-Layer-DVD/Recordable and Dual-Layer-Blu-Ray disks, with photopolymer thicknesses of approximately 50 micrometer and approximately 20 micrometer, respectively. The nature of the deposited layers (semireflective, metallic, dye etc.) depends on the type of disk to be manufactured. Similar to the surface transfer process, the stamper is made of a plastic material with very low adhesion like PMMA or cyclic polyolefins. This stamper has to be removed from the (coated) first substrate, similar to the surface transfer process, before further processing.

The 2P-process can also be used in the production of disks with more than 2 layers by repeating the process steps described above.

One critical process step in the surface transfer process as well as the 2P-process is the separation of the dummy substrate or stamper from the first substrate without damaging the first substrate or deposited layers. U.S. Pat. No. 6,117,284 proposes PMMA for the dummy substrate in the production of DVD-14 or DVD-18. PMMA, however, requires quite different molding parameters (temperatures, pressure, cooling time, pit shape etc.) from the standard Polycarbonate and would preferably be avoided. In the 2P-process the stamper commonly is made by injection molding from cyclic polyolefins. Similar problems as in the production of PMMA occur, as different molding parameters as well as high cost of this material. In the production process it would be very convenient to have just one plastic material as base for the first and the dummy substrates or stamper, respectively. Since polycarbonate is the material used most commonly in the production of optical disks, this material should be used for the dummy substrate or stamper, respectively, as well. However, polycarbonate shows high adhesion and can not be separated in both production processes.

SUMMARY OF THE INVENTION

It is therefore proposed for manufacturing an optical disc substrate to deposit onto a first substrate with at least one structured surface an anti-adhesive layer, preferably carbon, and a first layer on top of said anti-adhesive layer. On a second substrate with a structured surface also a layer is deposited. Both substrates are bonded together with the layers facing each other. The separation now easily can take place afterwards alongside the adhesive layer. This way the first layer from the first substrate is being transferred to the second substrate.

In a broader sense, this is a method for mapping the structure of the first substrate's surface onto a second substrate's surface, by introducing the first substrate in an evacuable chamber, reducing the pressure in the chamber to at least $10^{-3}$ mbar, introducing a working gas and depositing a carbon layer by means of magnetron sputtering onto the surface area to be mapped. After depositing a thin material layer onto the carbon layer this material layer can be transferred onto a second substrate, whereas the carbon layer remains at the first substrate.

SOLUTION ACCORDING TO THE INVENTION

The disk separation method according to both production processes described above is improved by using Polycarbonate for the dummy substrate or stamper, respectively, coating it with a very thin film of carbon or a carbon containing compound conforming to the pit structure and then continue with the process steps necessary for the production of whatever disk has to be produced. In the case of the production of DVD-14 and DVD-18 the next process step is to coat with a reflective film, made e.g. of aluminum or silver. The carbon-based anti-adhesive film allows easy separation of the dummy substrate or stamper, respectively, after bonding with the first substrate.

Different methods have been used for the deposition of the carbon or carbon containing anti-adhesive film:

1) Deposition of a Liquid Film With High Viscosity by a Vapor Deposition Method

A thermal evaporation source (Knudsen cell) was used to deposit a thin film of Silicon oil DC704 as used for diffusion pumps. The experiments showed, however, that the electrical signals from the DVD-substrate degraded to an unacceptable level for oil-thicknesses sufficient for simple separation from the first substrate. It is assumed that the liquid has a tendency to fill the pits of the substrate or forming islands.

2) Deposition of a Carbon Film With a PECVD-method

The idea was to form a teflon-like film on the substrate by polymerizing $C_4F_8$ on the substrate. However initial results showed no anti-adhesive effect.

In a second experiment, a plasma gun (as e.g. described in U.S. Pat. No. 5,017,835) was used to deposit a diamond like carbon layer on the substrate using $C_2H_2$ as gas during deposition. With 20 to 30 nm of deposited $CH_x$ a sufficient anti-adhesive effect was obtained with fair replication of pit structure. However the achievable deposition rates (up to 4 nm/sec) are not sufficient for a commercial use of this process at present, since standard DVD lines run at a cycle time of below or about 4 sec, whereas the carbon deposition requires about 7 sec to give reliable results. Furthermore, the electrical signals jitter increased somewhat for the thicknesses required for sufficient anti-adhesive effect.

Another disadvantage of this PECVD-method is the comparatively high cost of the plasma gun itself.

3) Sputter Deposition of Carbon

Sputtering of carbon gave the best results for anti-adhesive effect and small effect on electrical signals as for example jitter. The experimental results are given in the table below.

BRIEF DESCRIPTION OF THE DRAWINGS:

It being understood that none of the drawings is to scale (as some of the dimensions are in microns, as is well understood in the art)

DETAILED DESCRIPTION OF THE INVENTION

Figure 1:
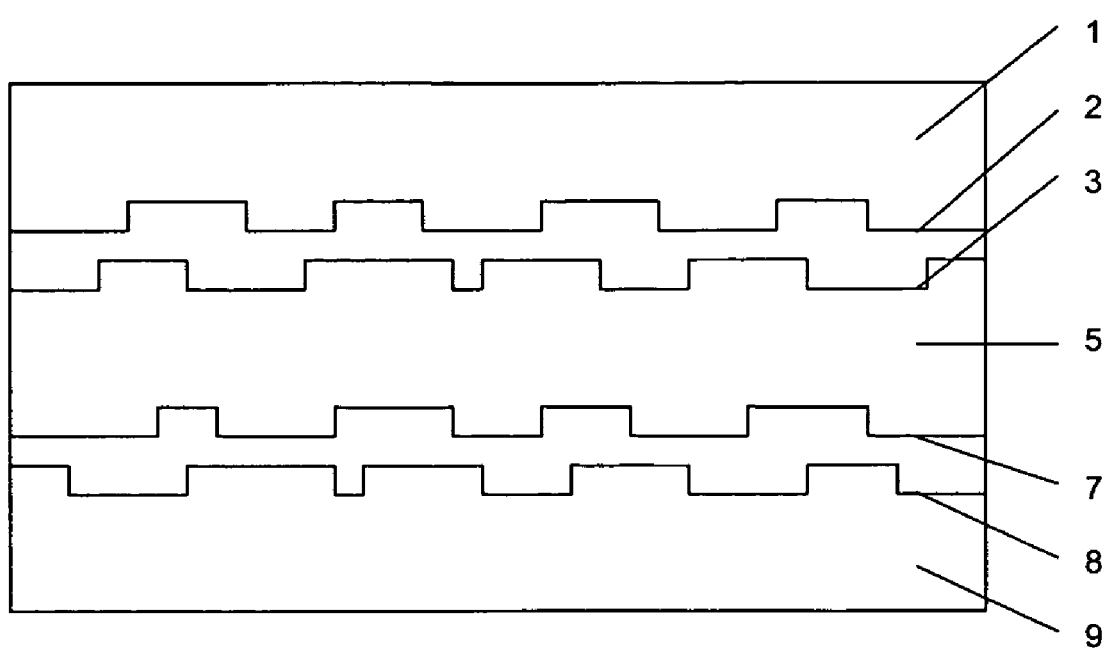
FIG. 1 depicts a prior art Dual-Layer, DVD-9 disc.
Figure 2:
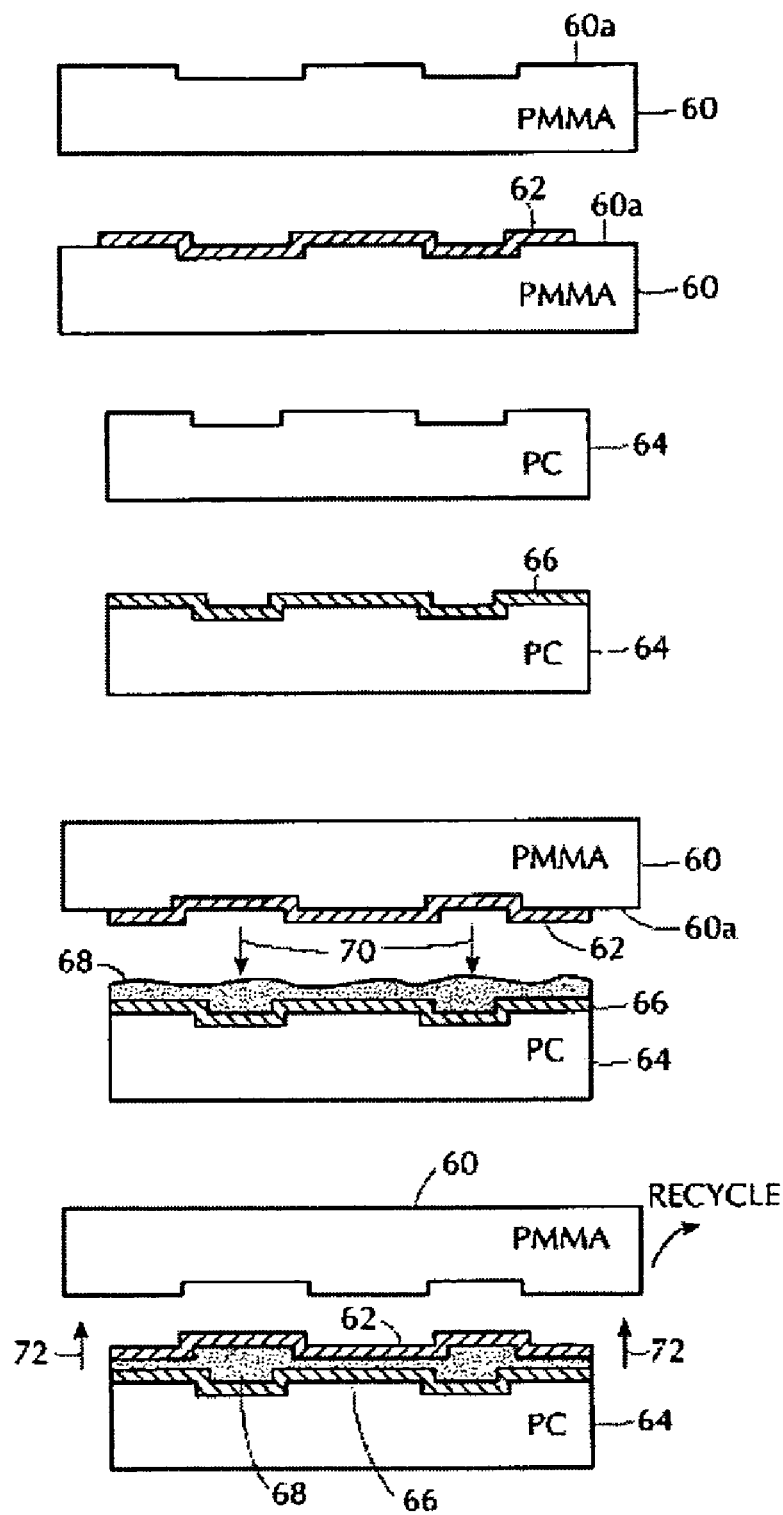
FIG. 2 depicts the steps in making a prior art double layer as usual in a DVD-9 manufacturing process.
Figure 3:
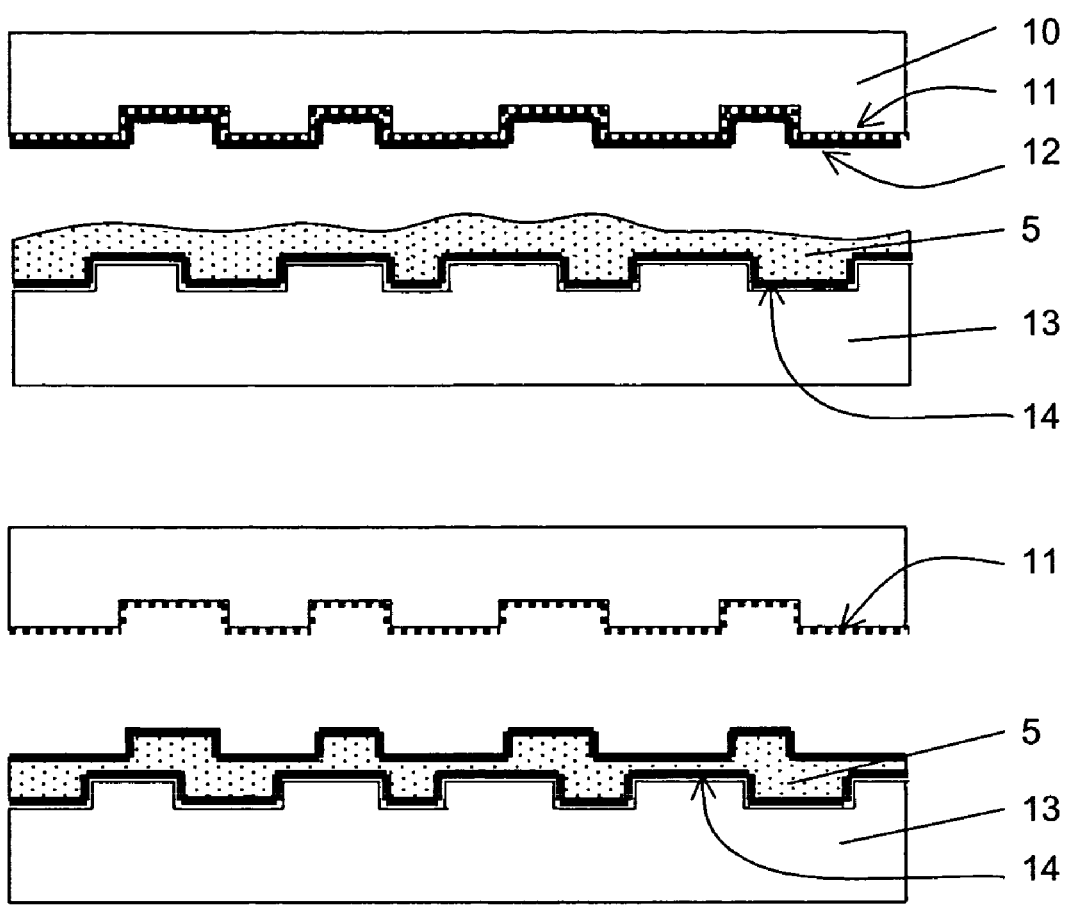
FIG. 3 shows a preferred embodiment for the production method of an optical storage media.

A preferred embodiment for the production method of an optical storage media, e.g. a DVD-18, is explained in more detail with reference to FIG. 3.

A first substrate 10, preferably made from polycarbonate (PC), is being produced, e.g. by injection molding. An anti-adhesive film 11 is applied to the surface of substrate 10, and, in a further production step a further layer 12 is applied on top of layer 11. Layer 12 may be reflective or semi reflective, preferably a thin metal layer.

The second substrate 13 is being produced like described above for the DVD 9 process, showing a layer 14, e.g. a semi-reflective layer. Adhesive 5 is being used to glue together first substrate 10 and second substrate 13. The separation after this bonding step results in a transfer of layer 12 from substrate 10 to substrate 13. Anti-adhesive film 11 should remain after separation preferably on substrate 10.

The equipment used to practice the inventive method may comprise: Vacuum deposition systems for depositing an anti-adhesive layer on a disk with structured pits, in particular a sputtering system, preferentially a DC magnetron sputter system.

The combination of an anti-adhesive layer deposition chamber and a metal layer deposition chamber attached to a common transport chamber for the deposition of a removable metal layer on a structured substrate The usage of two sputter stations for depositing an anti-adhesive layer within the required cycle time (2.5 to 4 sec is commonly used in the production of DVD-9)

The usage of a focus target for increased sputter rate and reduced sputter time (see Heinz et. al. U.S. Pat. No. 6,682, 637).

FURTHER ADVANTAGES OF THE INVENTION

DVD-14 and DVD-18 production normally is only a fraction of total DVD production; therefore it is desirable to produce DVD-18 on the same production lines as DVD-5 or DVD-9, with as little modification as possible. The present invention can be integrated easily into an existing DVD-9 line. The basic DVD-9 line can be used with two standard polycarbonate molding machines and a standard bonding module. The only change required is an additional anti-adhesive deposition module. This can be integrated into the sputter module, e.g. by replacing the single station sputter coating station with a dual station coating module. These new modules are compact enough to fit as a replacement in the space of the previously used single sputter module. Switching from DVD-18 to DVD-9 production requires no hardware modification (no change of PMMA to PC in the molding machine in particular). The anti-adhesive coating step can be skipped in the DVD-9 production. The additionally required substrate separation and final bonding step require the same offline equipment as the prior art DVD-18 process.

An additional advantage is that the dummy substrate can be removed from the reflective layer without damage and reused several times after fresh coating.

Recycling is simplified as the PC recycling is already in place and no different material has to be recycled.

In the production of Dual-layer-DVD/Recordable and Dual-layer-Blu-Ray disks the usage of cyclic polyolefins in the 2P-process is discussed frequently. However, this material is difficult to mold, especially for the Dual-layer-DVD/ Recordable process and the usage of polycarbonate for the stamper improves the quality of the disk. Furthermore, the cost of cyclic polyolefins is quite high compared to polycarbonate so that a significant reduction of production costs is achieved.

Application in the Optical Mastering Process

The anti-adhesive film may also find an application in the production of optical masters, used as stampers in the molding equipment for producing optical disks. Here we have the problem that the structured photoresist which is metallized first by sputtering and then by galvanization cannot be separated from the metal without leaving adhering particles on the metal master. An anti-adhesive layer applied by the method above of similar thickness, conforming to the-structured photoresist may also solve this problem, using corresponding equipment as described above. Under favorable circumstances the photoresist master may be reused as well.

Experimental Results

A standard UNAXIS sputtering system equipped with a sputter source of type ARQ131 was used to deposit carbon films with DC magnetron sputtering in an Ar atmosphere for the production of DVD-18 with the sputtered carbon layer.

Process Parameters:
Power 5 kw U: 670V I: 7.5 A
Flow: 5 sccm Ar, p=$10^{31}$ $^3$ mbar
Sputter time: 2-10 sec
Sputter rate: approx. 2-2.5 nm/sec
Sputter target: Graphite
L1 layer: Ag alloy The first substrate and the dummy substrate were bonded with a vacuum bonding machine manufactured by Unaxis, using a standard bonding lacquer (DIC SD6200). After separation of the dummy substrate the first substrate was rebonded to simulate the production of a DVD-14 or DVD-18.

Optimum results were obtained at 4-6 sec sputter time (approximately 8-12 nm film thickness of Carbon).

The following table shows some experimental results of electrical signals, obtained with a CATS disc tester from Audio development. (PI Sum 8 ave refers to a DVD error rate (parity error)). For 3-6 sec sputter time the studied electrical signals were well within specification after separation and rebonding to a dummy substrate.

| Sample # | Sputter time (s) | Before separation | | | After rebonding to dummy substrate | | | % transfer |
|---|---|---|---|---|---|---|---|---|
| | | PI Sum 8 ave | DC jitter ave (%) | DC jitter max (%) | PI Sum 8 sep | DC jitter sep (%) | DC jitter max (%) | |
| 144 | 2 | 3.8 | 6.34 | 8.16 | n.m. | n.m. | n.m. | 90% |
| 145 | 3 | 4.5 | 6.46 | 8.24 | 14 | 6.166 | 8.58 | 95% |
| 146 | 4 | 5.4 | 6.63 | 8.87 | 6.1 | 6.251 | 8.58 | 100% |
| 147 | 5 | 14.3 | 6.596 | 8.75 | 14.5 | 6.4 | 8.89 | 100% |
| 148 | 4 | 10.3 | 6.784 | 8.89 | 9.7 | 6.15 | 8.56 | 100% |
| 149 | 6.0 | 5.3 | 6.61 | 8.97 | 7.5 | 6.148 | 8.62 | 100% |
| 150 | 8.0 | 4.9 | 6.834 | 9.11 | 18.3 | 6.452 | 9.41 | 100% |
| 151 | 10.0 | 4.6 | 6.859 | 9.15 | 27.9 | 6.705 | 10.35 | 100% |

With lower film thickness (2-3 sec sputter time corresponding to approximately 4-6 nm thickness) separation is critical but can be improved by process optimization. At larger film thickness the electrical signals (in particular jitter) deteriorate, but could be improved by adjusting pit geometry to the film thickness. From the standpoint of compatibility with the DVD-9 process it is however preferable to use lower film thickness, so the same stamper geometry can be used for DVD-9 as for DVD-14/18.

REFERENCE NUMERALS

1, 9 substrate
2, 8 semi-reflective data layer
3, 7 fully reflective data layer
5 glue, adhesive
10 first substrate
11 anti-adhesive layer, anti-adhesive film (dotted line in FIG. 3)
12 layer, semi-reflective/reflective (continuous line in FIG. 3)
13 second substrate
14 layer, semi-reflective/reflective (continuous line in FIG. 3)
60 substrate, with a surface 60a with embossed information
62 reflective layer
64 substrate, preferably comprising PC (polycarbonate)
66 semireflective layer
68 glue, adhesive

The invention claimed is:

1. Method for manufacturing an optical disc substrate, said method comprising:
  Providing a first substrate with at least one structured surface
  Depositing on said surface an anti-adhesive layer
  Further depositing a first layer on top of said anti-adhesive layer
  Providing a second substrate with at least one structured surface
  Depositing on the surface of said structured surface a second layer
  Bonding said first and second substrate with the layer-coated surface facing each other
  Separating said bonded substrate alongside the anti-adhesive layer such that said first layer is being transferred to the second substrate.

2. Method according to claim 1, wherein said first and second substrate comprise polycarbonate.

3. Method according to claim 1, wherein said first and second layer are metal layers.

4. Method according to claim 1, wherein said first layer is a semi-reflective layer and said second layer is a reflective layer.

5. Method according to claim 1, wherein the bonding is achieved by means of an adhesive.

6. Method according to claim 1, wherein the anti-adhesive layer comprises carbon.

7. Method according to claim 6, wherein the anti-adhesive layer is deposited by magnetron sputtering.

8. Method according to claim 6, wherein the anti-adhesive carbon layer is thicker than 6 nm.

9. Method according to claim 6, wherein the anti-adhesive carbon layer is 8-12 nm thick.

10. Method for mapping the structure of a first substrate's surface onto a second substrate's surface, said method comprising:

Introducing the first substrate in an evacuable chamber

Reducing the pressure in the chamber to at least $10^{-3}$ mbar

Introducing a working gas

Depositing a carbon layer by means of magnetron sputtering onto the surface area to be mapped Depositing a thin material layer onto the carbon layer and Transferring said material layer onto a second substrate, whereas the carbon layer remains at the first substrate.

11. Method according to claim 10, wherein the second substrate is a disc shaped information carrier.

* * * * *